United States Patent [19]

Sugawara

[11] Patent Number: 4,553,125
[45] Date of Patent: Nov. 12, 1985

[54] HIGH VOLTAGE RESISTANCE ELEMENT

[75] Inventor: Yoshitaka Sugawara, Hitachi, Japan

[73] Assignee: Hitachi, Ltd., Tokyo, Japan

[21] Appl. No.: 434,057

[22] Filed: Oct. 13, 1982

[30] Foreign Application Priority Data

Oct. 14, 1981 [JP] Japan ................. 56-162651

[51] Int. Cl.$^4$ ................................ H01C 3/10
[52] U.S. Cl. .................... 338/283; 338/218; 338/284; 338/293; 338/287
[58] Field of Search ......... 338/195, 218, 280, 283, 338/284, 287, 292, 293, 295

[56] References Cited

U.S. PATENT DOCUMENTS

| | | | |
|---|---|---|---|
| 3,564,475 | 2/1971 | Fujii et al. ............ | 338/292 X |
| 4,123,741 | 10/1978 | Kiyono et al. ........ | 338/293 X |
| 4,196,411 | 4/1980 | Kaufman ............... | 338/314 |
| 4,344,064 | 8/1982 | Bitler .................... | 338/295 X |

FOREIGN PATENT DOCUMENTS 56-33863 8/1981 Japan .

Primary Examiner—Volodymyr Y. Mayewsky
Attorney, Agent, or Firm—Antonelli, Terry & Wands

[57] ABSTRACT

A resistance element capable of withstanding a high voltage is formed through impurity diffusion in a single crystal island of a semiconductor integrated circuit substrate. The resistance element includes a resistive region formed in an exposed surface of the single crystal island and folded reciprocatively by at least one and a half turns in a planar zigzag-like pattern. The pitch at which the resistive region is folded is decreased as viewed in the direction in which extension of depletion layer formed within the single crystal island upon application of a voltage between two ends of the resistive region is decreased.

4 Claims, 6 Drawing Figures

HIGH VOLTAGE RESISTANCE ELEMENT

The present invention relates to a resistance element which is capable of withstanding a high voltage and which requires a reduced area for realization in an integrated circuit (IC).

In recent years, semiconductor technology has made remarkable progress, and it seems that many efforts are being actively made for developing which is capable of handling or withstanding higher voltages than 100 V (volts). As typical applications of such high voltage rated IC's, there can be mentioned crosspoint switches for exchanges, subscriber circuits, vertical output circuits and voice output circuits for television receivers, various circuits for handling audio frequency signals, various types of switching regulators and others. These high voltage rated IC's and particularly the high voltage rated linear IC's have to incorporate indispensably resistance elements or resistive regions which are capable of withstanding high voltages, i.e. of showing high breakdown voltages.

In the case of a low voltage rated IC of the hitherto known structure, the area in a semiconductor wafer occupied by a passive element such as a resistive element is large as compared with the area occupied by an active element. Under the circumstances, the circuit which is designed in such a manner that functions of the passive elements are performed by active elements has been developed for promoting the realization of various circuits in the form of IC. The same approach is also adopted in the development of the high voltage rated IC's which are capable of handling and withstanding high voltages.

However, in the high voltage rated IC and inter alia in the case of the high voltage linear IC, there exist many circuit portions which require indispensably the resistance elements capable of withstanding a high voltage and make it impractical to replace these resistance elements by active elements because otherwise the number of the latter would be surprisingly increased. Further, since a major proportion of the area occupied by a single high voltage rated active element is allotted for assuring the high voltage withstanding capability, that is, since the major portion of the area in concern is subjected to restriction imposed by the extent of the depletion layer, the IC in which each of the high voltage rated resistance elements is replaced by two or more high voltage rated active elements will necessarily require an increased area which is remarkably larger than the area required by the conventional low voltage IC. Besides, for the purpose of reducing the overall power consumption of the high voltage rated IC, the resistance elements incorporated therein are required to exhibit, in addition to the high voltage withstanding capability, a high resistance value of 1 k$\Omega$ or more for limiting the current produced upon application of high voltage. Under the circumstances, in the field of the IC technology, there has been a great demand for the resistance element which is capable of withstanding a high voltage and which requires only a reduced area for realization thereof while exhibiting an improved linearity upon application of the high voltage.

At present, however, study and endeavour paid to the development of the high voltage rated resistance element are not yet satisfactory, and the inventors have found scarcely any reports which deal with this problem.

For realizing the high voltage rated resistance element capable of withstanding the high voltage, it is necessary to first implement such a structure in which the increase in the area occupied by the extent of the depletion layer can be reduced to a possible minimum. In the case of the resistance element for the low voltage rated IC, the area occupied by the resistance element or resistive region is determined by the sheet resistivity thereof and accuracy with which the resistive region is realized. The pitch or distance between the individual resistive regions can be made sufficiently small. For this reason, the resistance element or resistive region of the low voltage rated IC is formed in a regular zigzag-like or meandering pattern in which the distance between the individual turns or segments, i.e. the pitch of turn is maintained constant throughout the meandering pattern. By way of example, reference is to be made to Japanese Patent Publication No. 33863/1981. In contrast, in the case of the high voltage rated resistance element to be realized an IC, the area occupied by the resistive region is primarily determined by the extent of the depletion layer. As the consequence, a high voltage rated IC resistance element realized on the same principle as the low voltage rated resistance element would require a very large area.

For making it possible to realize the high voltage rated resistance element (i.e. the resistance element capable of withstanding high voltage), the structure of the resistance element has to be such that the high sheet resistivity can be obtained. In the case of the low voltage rated IC, there can be mentioned a pinch resistor which exhibits high sheet resistivity. This pinch resistor is generally prepared through the same process an npn-type transistor with a view of simplifying the manufacturing process as a whole. As the result, the breakdown voltage of the pinch resistor is as low as the breakdown voltage of the emitter junction of the npn-transistor, i.e. in the range of 6 to 15 volts.

It is an object of the present invention to provide a resistance element for an IC which is capable of withstanding a high voltage and requires a reduced area for the realization.

In view of the above object, there is provided according to a feature of the present invention a high voltage rated resistance element which includes a resistive region of a first conductivity type formed through diffusion of impurity in a major exposed surface of a single crystal island having a second conductivity type opposite to the first conductivity type and formed in a semiconductor integrated circuit, characterized in that the resistive region is formed in a folded zigzag-like planar pattern of at least one and a half turns, and the pitch of folded segments being progressively decreased in the direction in which the extent of depletion layer formed within the single crystal island is decreased.

The invention will be better understood from the description of exemplary embodiments thereof taken in conjunction with the accompanying drawings, in which.

Figure 1A:
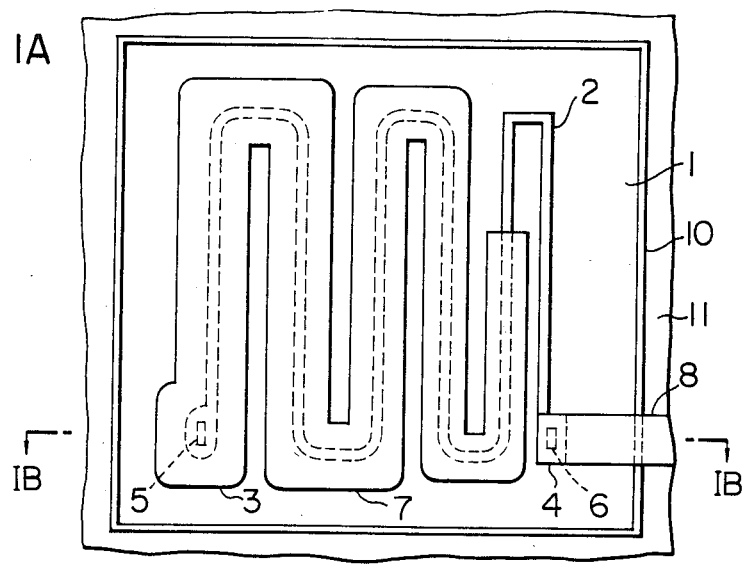
FIG. 1A shows in a plan view a resistance element capable of withstanding a high voltage according to an embodiment of the invention.
Figure 1B:
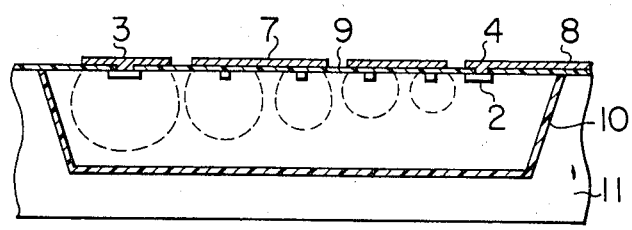
FIG. 1B is a sectional view of the resistance element taken along line IB—IB in FIG. 1A.

Now, the invention will be described by first referring to FIGS. 1A and 1B which show, respectively, a surface pattern and a cross-sectional profile of resistance element capable of withstanding a high voltage according to an embodiment of the invention. The illustrated resistance element is destined to be embodied as a linear IC resistor capable of withstanding a high DC voltage and exhibit a resistance value of 30 k$\Omega$ upon application of $-400$ V across both the terminals of the resistance element. The resistance element is realized by diffusing boron in a n-type single crystal island 1 of Si which is formed in a Si-wafer with an impurity concentration of $3 \times 10^{14}$ cm$^{-3}$ and isolated by dielectric insulation. More specifically, a reference numeral 2 denotes a diffused region destined to serve as the resistance element, 3 and 4 denote, respectively, terminals of the resistance element, 5 and 6 denote, respectively, contact areas, 8 denotes an electrode, 9 denotes a passivation film of SiO$_2$, 10 denotes an SiO$_2$-film for dielectric isolation, and 11 denotes a carrier region of polycrystal silicon. The boron-diffused resistive region 2 of an elongated configuration has a depth of 5 $\mu$m and a sheet resistivity of 100 $\Omega/\square$. Assuming that the diffused resistive region 2 has a width of 10 $\mu$m, the total length of the region 2 required for attaining a resistance value of 30 k$\Omega$ will amount to about 3,000 $\mu$m. In view of the effective utilization of available area, the diffused region 2 is realized in a zigzag-like or meandering pattern folded in three turns or six segments each having a length of about 460 $\mu$m. The spaces or pitches between the adjacent individual resistive segments are so selected as to be progressively decreased as viewed in the direction from the terminal 3 to which a low or negative voltage is applied toward the terminal 4 to which the high or ground potential is applied, say, in the order of 80 $\mu$m, 70 $\mu$m, 60 $\mu$m, 50 $\mu$m and 30 $\mu$m, as viewed from the side of the terminal 3, with a view to sparing those portions which play no part in sustaining a predetermined voltage. When a negative voltage of $-400$ V is applied to the terminal 3 with zero volt or ground potential being applied to the terminal 4, the potential at the single crystal island 1 in which the resistive region 2 is formed is about 0.6 V. Accordingly, the voltage applied across the pn-junction defining the resistive region 2 becomes correspondingly increased as the pn-junction approaches to the terminal 3. As the consequence, the width of depletion layers formed within the n-type single crystal island 1 becomes progressively decreased as the depletion layer is located farther away from the terminal 3, as is indicated by broken lines in FIG. 1B. This means that pitch interval between the adjacent segments of the zigzag pattern which is required for assuring the desired voltage withstanding capability can be correspondingly decreased for the segments remote from the terminal 3. Here, with the term "pitch", it is intended to mean the inter-segment center interval which is derived by adding tolerance involved in the resistance manufacturing process to calculated widths of the depletion layers at the various segments of the zigzag-like resistive (diffused) region 2.

In the case of the embodiment now being described, the electrode 7 attached to the low or negative voltage terminal 3 is caused to extend along and over the diffused resistance region 2 in such a manner that the electrode 7 laterally extends or spreads beyond both sides of the pn-junction defining the resistive region 2. The laterally spreading electrode 7 thus can serve as a so-called field plate. Describing in more detail, the passivation layer 9 of SiO$_2$ prepared by an IC fabrication process may generally contain positive electric charge, as the result of which negative carriers and/or negatively charged elements may be attracted onto the surface of the n-type single crystal island 1, whereby the impurity concentration will be increased at the surface of the n-type island 1 as compared with the interior of the island 1. When this occurs, the extent of the depletion layer is suppressed at the surface of the n-type island 1 with the intensity of surface electric field being increased to thereby lower the breakdown voltage. In this connection, it should be noted that field plate constituted by the laterally spreading electrode 7 is at a lower potential as compared with the n-type single crystal island 1 and thus can repulse the negative carriers and/or the negative charge to thereby suppress the tendency of the impurity condensation at the surfacial region of the n-type single crystal island 1 and prevent the lowering of the breakdown voltage.

In the case of the embodiment being now considered, the length of the field plate 7 is so selected as to satisfy the condition defined by the following expression:

$$\text{(Length of field plate)} \approx \text{(length of resistive region)} \times \frac{\text{(applied voltage} - 100 \text{ V)}}{\text{applied voltage}}.$$

Further, the width of the field plate, i.e. the width of the electrode 7 laterally spreading beyond the sides of the pn-junction of the resistive region 2 is selected to be larger as it is located nearer to the terminal 3. More specifically, the overhang widths of the laterally spreading electrode 7 are selected to be 25 $\mu$m, 20 $\mu$m, 15 $\mu$m, 10 $\mu$m and 5 $\mu$m for the first to the fifth segments, respectively, as counted from the side of the terminal 3, so that concentration of the electric field may be mitigated more forcively at the surface portion where higher voltage is applied.

Further, corners of the resistive region 2 are rounded with an appropriate curvature to further mitigate the concentration of the electric field. Additionally, the passivation film 9 of SiO$_2$ is made as thick as 3.1 $\mu$m so that the SiO$_2$-film 9 may be protected from dielectric breakdown at the potential difference of about 310 V applied between the resistive region 2 and the end of the field plate 7 locate farthest from the terminal 3 across the passivation film 9.

The field plate 7 serving also as the electrode may be spared over a portion of the resistive region which is located nearer to the terminal 4 of the ground potential for the reason mentioned below. Experiments carried out by the inventors of the present application have shown that the breakdown voltage of the pn-junction in the case where no field plate is present is relatively more sensitive to the influence of the amount of positive charge present in the SiO$_2$-passivation layer 9 and thus varies significantly in dependence on lots. It has however been found that the breakdown voltage of the pn-junction is never lower than 100 V in case the depth of the pn-junction is greater than 2 μm. Accordingly, the field plate may be spared at the portion where the applied voltage is low. When the field plate 7 is so provided as to extend from the terminal 3 at which the highest reverse voltage is applied to the pn-junction forming the resistive region 2 to a location of the pn-junction at which the applied reverse voltage becomes equal to or lower than 100 V, there can be assured a breakdown voltage which is comparable to that attained with the aid of the field plate which extends to the vicinity of the terminal 4. In general, as the width of the field plate or electrode 7 spreading laterally outwardly beyond the width of the pn-junction forming the resistive region 2 is increased, the electric charge on the surface of the n-type single crystal island 1 can be more mitigated. However, in the case of the resistive element 2, the applied voltage is progressively decreased as viewed in the direction from the terminal 4 to the terminal 3. For this reason, the width of the field plate 7 may be correspondingly progressively decreased, as viewed in the same direction. On the contrary, in the case where the width of the field plate 7 is uniformly distributed over and along the whole length of the resistive region 2 with a constant width selected for the portion at which the highest voltage is applied, the pitch of the segments of the resistive region 2 folded in the zigzag-like pattern could not be progressively reduced due to the limitation imposed by the constant width of the field plate 7. In contrast, in the case of the embodiment shown in FIGS. 1A and 1B, it is possible to progressively reduce the pitch down to the value determined by the smallest width of the depletion layer, as described hereinbefore.

It has been found that the embodiment of the invention described above allows the area occupied by the resistive region 2 to be reduced by 38% when compared with the prior art resistance element in which the inter-segment pitch is selected constant at 80 μm. As is well known, the passive elements such as resistors and the like occupy larger area in the integrated circuit or IC as compared with the active elements. Accordingly, the significant decrease in the area occupied by the resistor which can be attained according to the teaching of the invention disclosed above makes a great contribution to the reduction in size of the chip used for the IC.

Figure 2:
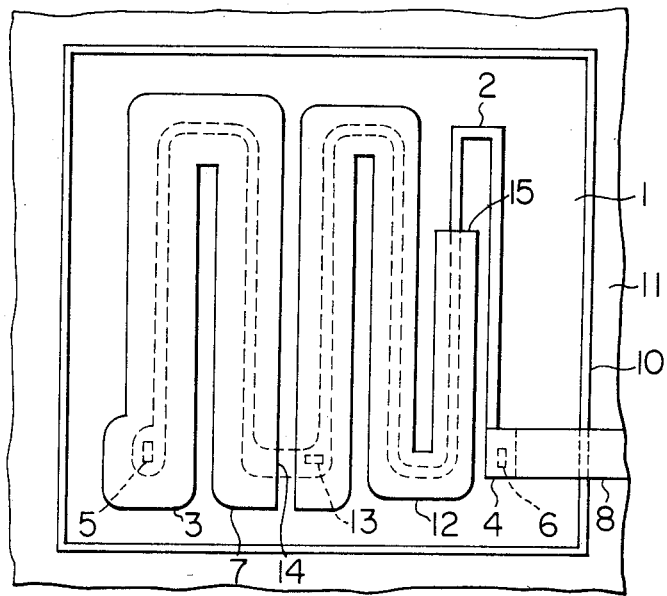
FIG. 2 is a plan view showing a resistance element capable of withstanding a high voltage according to another embodiment of the invention.

FIG. 2 shows a surface pattern of the resistance element realized according to a second embodiment of the invention.

This embodiment is substantially identical with the resistance element described above in conjunction with FIGS. 1A and 1B except that the field plate is divided into two parts, one of which designated by 12 is connected through a through-hole 13 to the resistive region 2 at an intermediate portion between the terminals 3 and 4, and that the oxide film 9 interposed between the field plates and the resitive region 2 is formed as thin as 1.5 μm.

When the voltage of −400 V is applied to the terminal 3 in the resistance element now being considered, the voltage making appearance at a portion 14 of the resistive region 2 located in opposition to that portion of the first field plate 7 which is located farthest from the terminal 3 will be about −250 V, producing a potential difference of about 150 V relative to the first field plate 7 (−400 V). On the other hand the second field plate 12 is connected through the contacting through-hole 13 to the resistive region 2 at a location to which a voltage of about −248 V is applied. Under these conditions, the potential at the second field plate 12 is on the order of −248 V even at an end portion 15 thereof which is located closest to the terminal 4 and located farthest from the through-hole 13. The potential at the portion of the resistive region 2 located in opposition to the end portion 15 is about −100 V which corresponds to the potential difference of about 150 V appearing between the second field plate 12 and the resistive region 2 at the end portion 15.

As will be appreciated from the above description, the structure of the resistance element according to the second embodiment of the invention allows the maximum potential difference appearing between the resistive region 2 and the field plate (7, 12) to be made smaller than the corresponding potential difference produced in the resistance element according to the first embodiment. For this reason, the interposed oxide film 9 may be made considerably thinner than that of the first embodiment while assuring a sufficiently high voltage withstanding capability to prevent the dielectric breakdown. The second embodiment provides a great advantage in the manufacturing process. More specifically, in the case of the first embodiment of the invention, a step of forming the thick oxide film, i.e. the wet oxidizing process or a number of CVD processes or the like which take a lot of time is required in succession to the step of diffusing boron for forming the resistive region 2. In contrast, in the case of the second embodiment of the invention, formation of the oxide film can be accomplished by a single CVD process or by a thermal processing step effected in the mixed atmosphere of hydrogen and oxygen in succession to the diffusion of boron.

Figure 3A:
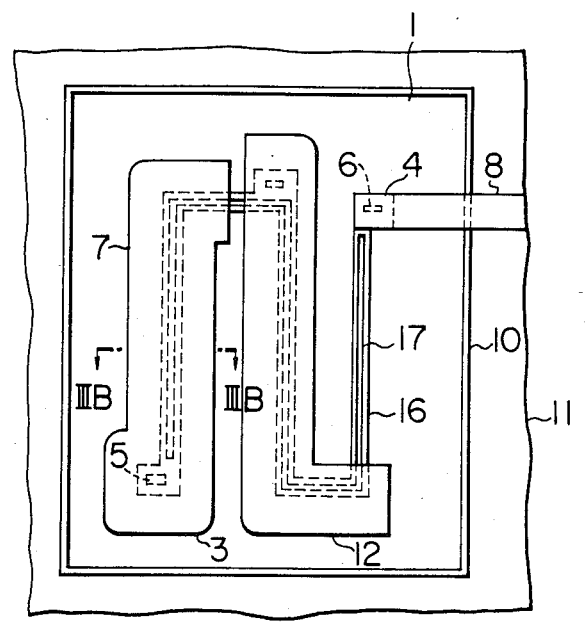
FIG. 3A shows in a plan view a resistance element capable of withstanding a high voltage according to a further embodiment of the invention.
Figure 3B:
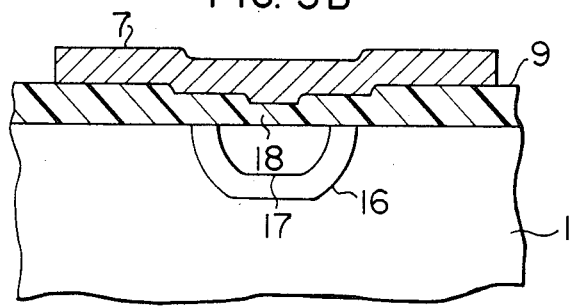
FIG. 3B is a sectional view of the resistance element taken along the line IIIB—IIIB in FIG. 3A.

FIG. 3A shows a surface pattern of the resistance element according to the third embodiment of the invention, and FIG. 3B shows a partially enlarged cross-sectional view of the same taken along the line IIIB—IIIB in FIG. 3A.

The resistance element according to the third embodiment of the invention is destined to be incorporated in an IC for a high DC voltage and exhibit a resistance value of 300 kΩ upon application of −400 volts between both terminals 3 and 4. For realizing the resistance element according to the third embodiment, an n-type single crystal island 1 having impurity concentration of $3\times10^{14}$ cm$^{-3}$ and formed in a Si-wafer through dielectric isolation is formed with a p-type layer 16 through diffusion of boron, which is followed by diffusion of phosphorus the same aperture as used in the diffusion of boron to thereby form an n-type layer 17 which constitutes a pinched portion through cooperation with the p-type layer 16. Subsequently, electrodes 7 and 8 and then the field plate generally denoted by 12 are formed to obtain the finished resistance element.

Diffusion depths of boron and phosphorus are of 5 μm and 3.5 μm, respectively, while the sheet resistivity of the pinched portion is of 3 kΩ/□. Since the width of the resistive region is selected equal to 10 μm, the overall length of the resistive region is 1,000 μm. The resistance element is formed in a folded zigzag-like pattern of 1.5 turns so as to have three segments each of 320 μm in length. The pitch between the adjacent segments is selected 100 μm on the side of the terminal 3 to which a low voltage is applied, while the pitch is decreased to 60 μm on the side of the terminal 4 to which a high voltage (ground potential) is applied. The advantages due to the arrangement of this third embodiment are substantially the same as those brought about in the first embodiment of the invention described hereinbefore. It will be noted that the field plate is divided into two parts for the purpose and effect as in the case of the second embodiment.

Since the concentration profile of the p-type layer 16 of the third embodiment now being considered is set to the same profile of a npn-type transistor destined for handling a voltage on the order of 400 volts, there is no danger of the p-type layer 16 being punched through even at a region in the vicinity of the terminal 3. It should also be noted that the n+-layer 17 is connected to neither electrode nor field plate but is in the floating state. Accordingly, there is present between the n+-type layer 17 and the p-type layer 16 a potential difference of 0.6 volts which corresponds to the diffusion (built-in) potential, and thus no breakdown will occur in the n+p-junction even in the vicinity of the terminal 3. Further, because the oxide film 9 formed above the n+-type layer 17 is in thickness of 1.5 μm or more even at the thinnest portion 18 of the underlying diffusion aperture portion, the possibility of dielectric breakdown is excluded even at the highest potential difference of 140 V appearing between the field plate and the n+-layer 17. In other words, the high voltage withstanding capability comparable to that of the first and the second embodiments can be realized. On the other hand, the area occupied by the resistive region can be reduced down to about 1/30 of that of the first and the second embodiments by virtue of the fact that the sheet resistivity can be realized 30 times as high as that of the first and the second embodiment.

It should be added that in the case of the third embodiment, the capability of withstanding the voltage in the range of 120 to 250 volts can be attained even when the field plate is not employed. The resistance element of this arrangement (i.e. without the field plate) may be satisfactorily used in the IC destined to handle the voltage on the order of 100 volts.

Figure 4:
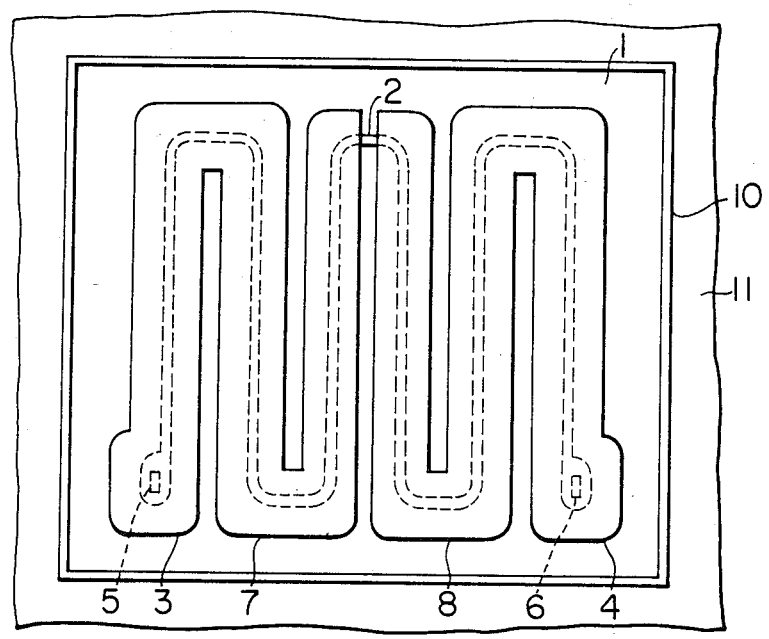
FIG. 4 shows in a plan view a high voltage resistance element according to still another embodiment of the present invention.

FIG. 4 shows a resistance element according to the fourth embodiment of the invention.

The resistance element according to the fourth embodiment is intended to be incorporated as a linear IC element which is capable of withstanding a high AC voltage and which exhibit a resistance value of 30 kΩ upon appearance of a voltage difference of 400 volts between both terminals 3 and 4 to which voltages of different polarities are applied.

The resistance element according to the fourth embodiment is different from the second embodiment only in respect of the pitch and the length and width of the field plates. In the case of the fourth embodiment being considered, the inter-segment pitch is selected to be 80 μm, 70 μm, 60 μm, 70 μm and 80 μm as viewed from the contact 3. One (7) of the field plates extends from the terminal 3 toward the terminal 4 about 1480 μm, while the second field plate 8 extend from the terminal 4 toward the terminal 3 for ca. 1480 μm. Further, the width of the field plates are selected at 25 μm, 20 μm, 15 μm, 15 μm, 20 μm and 25 μm for each of the resistive segments in the direction viewed from the terminal 3.

In the case of the instant embodiment, the terminal to which the low voltage is applied is alternately exchanged between the terminals 3 and 4 as the polarity of the voltage applied across these terminals are changed. However, the potential at the n-type single crystal island 1 in which the resistive region 2 is formed is constantly at magnitude equal to the lowest voltage plus the diffusion potential at the resistive region. Accordingly, the width of the depletion layers produced upon application of the voltage of 400 volts will be decreased at one time and increased at another time as the polarity of the applied voltage is changed over. The resistance element according to the fourth embodiment is implemented with the geometrical parameters mentioned above in consideration of this fact. The resistance element according to the fourth embodiment of the invention allows the area occupied by the resistive region 2 to be reduced by ca. 5% as compared with the corresponding resistance element of the prior art. It will be seen that as the required breakdown voltage and the resistance value are increased, the occupied area can further be decreased.

In the foregoing, four preferred embodiments of the invention have been disclosed. However, it goes without saying that various and numerous modifications and versions will readily occur to those skilled in the art within the scope of this invention.

Further, it will be understood that the area of a wafer occupied by a resistive region can be minimized without imposing restriction on the extent of the depletion layer, and that the sheet resistivity can be increased without exerting adverse influence to the breakdown voltage or the voltage withstanding capability. Thus, the resistance element which is capable of withstanding a high voltage and requires a reduced area for realization thereof has been provided.

I claim:

1. A resistance element capable of withstanding a high voltage, comprising:
   (a) a resistive region of a first conductivity type formed in a major exposed surface of a single crystal island of a semiconductor integrated circuit, said island having a second conductivity type opposite to that of said resistive region; and
   (b) said resistive region being reciprocatively folded by at least one and a half turns in a planar pattern;
   (c) wherein pitch at which said resistive region is folded is progressively decreased as viewed in the direction in which an extent of a depletion layer formed within said single crystal island upon application of a voltage between both ends of said resistive region is decreased.

2. A resistance element according to claim 1, further including at least a first field plate connected to one of said ends of said resistive element and disconnected from the other end thereof and formed on a passivation layer formed on said single crystal island in conformity with the planar pattern of said resistive region, said field plate laterally spreading out beyond the width of said resistive region.

3. A resistance element according to claim 2, wherein a portion of said resistive region which is not covered with said first field plate is covered with a second field plate which is connected to said portion of said resistive element and disconnected from said other end, said second field plate being formed on said passivation layer along the planar pattern of said resistive portion while laterally spreading out beyond the width of said resistive region.

4. A resistance element according to claim 1, wherein said resistive region is formed in said major exposed surface through impurity diffusion.

* * * * *